(12) United States Patent
Woo et al.

(10) Patent No.: US 10,923,642 B2
(45) Date of Patent: Feb. 16, 2021

(54) LIGHT EMITTING DIODE AND LIGHT EMITTING DEVICE HAVING THE SAME

(71) Applicant: SEOUL VIOSYS CO., LTD., Ansan-si (KR)

(72) Inventors: Sang Won Woo, Ansan-si (KR); Ye Seul Kim, Ansan-si (KR); Tae Jun Park, Ansan-si (KR); Duk Il Suh, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 16/426,103

(22) Filed: May 30, 2019

(65) Prior Publication Data
US 2019/0371990 A1 Dec. 5, 2019

(30) Foreign Application Priority Data

May 30, 2018 (KR) .................. 10-2018-0061742
Mar. 20, 2019 (KR) .................. 10-2019-0032000

(51) Int. Cl.
*H01L 33/62* (2010.01)
*H01L 33/42* (2010.01)
*H01L 33/38* (2010.01)

(52) U.S. Cl.
CPC .............. *H01L 33/62* (2013.01); *H01L 33/38* (2013.01); *H01L 33/42* (2013.01)

(58) Field of Classification Search
CPC ......... H01L 33/62; H01L 33/38; H01L 33/42; H01L 33/405; H01L 33/00–648; H01L 27/15–156; H01L 33/44; H01L 2933/00–0091; H01L 33/46
See application file for complete search history.

(56) References Cited

U.S. PATENT DOCUMENTS

| 2015/0179879 A1* | 6/2015 | Yang |
| 2017/0077353 A1* | 3/2017 | Kim |
| 2019/0051797 A1* | 2/2019 | Sung |

\* cited by examiner

*Primary Examiner* — Shahed Ahmed
(74) *Attorney, Agent, or Firm* — H.C. Park & Associates, PLC

(57) ABSTRACT

A light emitting diode including an n-type semiconductor layer, a mesa disposed on the n-type semiconductor layer and exposing a portion thereof, and including an active layer and a p-type semiconductor layer, first and second bonding pads electrically connected to the n-type and p-type semiconductor layers, respectively, and a first insulation layer at least partially disposed between the exposed portion of the n-type semiconductor layer exposed by the mesa and the second bonding pad, in which the exposed portion of the n-type semiconductor layer has a first portion having a shortest distance to the second bonding pad, the first insulation layer covers a portion of the p-type semiconductor layer disposed between the second bonding pad and the first portion of the n-type semiconductor layer, and the first insulation layer is disposed along an edge of the p-type semiconductor layer adjacent to the exposed portion of the n-type semiconductor layer.

20 Claims, 17 Drawing Sheets

LIGHT EMITTING DIODE AND LIGHT EMITTING DEVICE HAVING THE SAME

CROSS-REFERENCE TO RELATED APPLICATIONS

This application claims priority from and the benefit of Korean Patent Application No. 10-2018-0061742, filed on May 30, 2018, and Korean Patent Application No. 10-2019-0032000, filed on Mar. 20, 2019, each of which is hereby incorporated by reference for all purposes as if fully set forth herein.

BACKGROUND

Field

Exemplary embodiments of the invention relate generally to a light emitting diode and a light emitting device including the same and, more specifically, to a light emitting diode that has high light output while securing good reliability under high humidity conditions and a light emitting device including the same.

Discussion of the Background

Semiconductor-based inorganic light emitting diodes are used in various fields including lighting, displays, vehicular headlights, and the like, and application fields thereof are continuously expanding in the art.

The light emitting diode has a structure in which a p-type semiconductor layer and an n-type semiconductor layer are disposed to face each other with an active layer interposed therebetween. In addition, electrodes are formed on the n-type semiconductor layer and the p-type semiconductor layer, respectively, to supply electric power to the light emitting diode, thereby generating light.

Such light emitting diodes are used under various conditions and are required to secure use safety even under unfavorable conditions. In particular, since the light emitting diodes are vulnerable to moisture, the light emitting diodes are required to pass an accelerated test under conditions of high temperature and high humidity.

Meanwhile, a protective layer is generally used to protect the light emitting diode from moisture. The protective layer covers the light emitting diode to prevent semiconductor layers or transparent electrodes from being exposed. As such, the protective layer prevents the light emitting diode from being damaged by external environments such as moisture.

However, since the protective layer is typically disposed on an optical path of light emitted from the light emitting diode, the protective layer absorbs a fraction of light, thereby reducing light output of the light emitting diode. For example, a light emitting diode without a protective layer has about 5% to 10% higher light output than a light emitting diode including a transparent protective layer formed of $SiO_2$.

Therefore, there is a need for a light emitting diode and a light emitting device that have high light output while securing good reliability under high humidity conditions.

The above information disclosed in this Background section is only for understanding of the background of the inventive concepts, and, therefore, it may contain information that does not constitute prior art.

SUMMARY

Light emitting diodes constructed according to exemplary embodiments of the invention are capable of reducing light output by a protective layer while securing good reliability even under high humidity conditions, and a light emitting device including the same.

It is to be understood that both the foregoing general description and the following detailed description are exemplary and explanatory and are intended to provide further explanation of the invention as claimed.

A light emitting diode according to an exemplary embodiment includes an n-type semiconductor layer, a mesa disposed on the n-type semiconductor layer to expose a portion of the n-type semiconductor layer, the mesa including an active layer and a p-type semiconductor layer disposed on the active layer, a first bonding pad electrically connected to the n-type semiconductor layer, a second bonding pad electrically connected to the p-type semiconductor layer, and a first insulation layer at least partially disposed between the exposed portion of the n-type semiconductor layer exposed by the mesa and the second bonding pad, in which the exposed portion of the n-type semiconductor layer has a first portion having a shortest distance to the second bonding pad, the first insulation layer covers a first portion of the p-type semiconductor layer disposed between the second bonding pad and the first portion of the n-type semiconductor layer, and the first insulation layer is disposed along an edge of the p-type semiconductor layer adjacent to the exposed portion of the n-type semiconductor layer.

A light emitting device according to another exemplary embodiment includes an n-type semiconductor layer, a mesa disposed on the n-type semiconductor layer to expose a portion of the n-type semiconductor layer, the mesa including an active layer and a p-type semiconductor layer disposed on the active layer, a first bonding pad electrically connected to the n-type semiconductor layer, a second bonding pad electrically connected to the p-type semiconductor layer, a bonding wire bonded to the second bonding pad, and an anti-metal migration layer disposed between the exposed portion of the n-type semiconductor layer and the second bonding pad, in which the anti-metal migration layer is spaced apart from the second bonding pad to oppose the first bonding pad, and is disposed along an edge of the p-type semiconductor layer disposed adjacent to the bonding wire.

A light emitting device according to a further exemplary embodiment includes a base, a first lead and a second lead disposed adjacent to the base, a light emitting diode including an n-type semiconductor layer, a mesa disposed on the n-type semiconductor layer to expose a portion of the n-type semiconductor layer, and including an active layer and a p-type semiconductor layer disposed on the active layer, a transparent electrode disposed on the p-type semiconductor layer, a first bonding pad electrically connected to the n-type semiconductor layer, a second bonding pad electrically connected to the p-type semiconductor layer, and a first insulation layer at least partially disposed between the exposed portion of the n-type semiconductor layer exposed by the mesa and the second bonding pad, bonding wires electrically connecting the light emitting diode to the first and second leads, and a molding portion covering the light emitting diode and the bonding wires, in which the first insulation layer is disposed along an edge of the p-type semiconductor layer adjacent to the exposed portion of the n-type semiconductor layer, the bonding wires are bonded to the first and second bonding pads, respectively, and the molding portion adjoins the first and second bonding pads of the light emitting diode, the transparent electrode, and the first insulation layer, and partially adjoins the n-type semiconductor layer exposed by the mesa.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
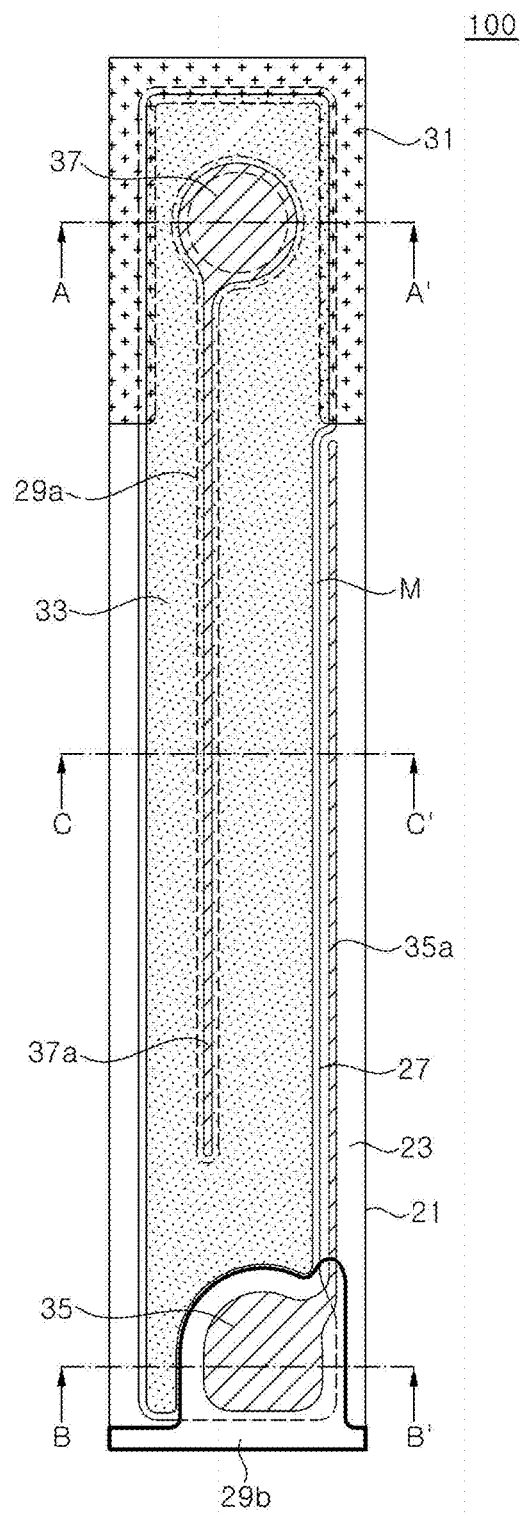
FIG. 1 is a schematic plan view of a light emitting diode according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

In accordance with exemplary embodiments of the present disclosure, a light emitting diode includes: an n-type semiconductor layer; a mesa disposed on the n-type semiconductor layer to expose a portion of an upper surface of the n-type semiconductor layer and including an active layer and a p-type semiconductor layer disposed on the active layer; a first bonding pad electrically connected to the n-type semiconductor layer; a second bonding pad for wire bonding electrically connected to the p-type semiconductor layer; and a first insulation layer at least partially disposed between an exposed region of the n-type semiconductor layer exposed by the mesa and the second bonding pad, wherein the first insulation layer covers a portion of a region of the p-type semiconductor layer between the second bonding pad and a portion of the exposed region of the n-type semiconductor layer exposed by the mesa and disposed nearest the second bonding pad, and is disposed along an edge of the p-type semiconductor layer adjacent the exposed n-type semiconductor layer.

With the first insulation layer, the light emitting diode can improve light output by preventing damage due to metal migration under high humidity conditions through elimination of a protective layer covering most of the mesa, thereby improving reliability.

The first insulation layer may be disposed closer to the exposed n-type semiconductor layer than the second bonding pad. In addition, the first insulation layer may partially cover the exposed n-type semiconductor layer.

The first insulation layer may have a greater length than a width of the second bonding pad. Furthermore, the first insulation layer may have a shape surrounding three sides of the second bonding pad.

In one exemplary embodiment, the mesa may have an elongated shape, the second bonding pad may be disposed near a distal end of the mesa at one side thereof in a longitudinal direction of the mesa so as to be opposite to the first bonding pad on the mesa, and the first insulation layer may partially cover a region of the p-type semiconductor layer between the second bonding pad and the distal end of the mesa.

The first insulation layer may cover a side surface of the mesa near the distal end thereof and the exposed n-type semiconductor layer.

The first insulation layer may extend from a portion near the distal end of the mesa along an edge of the mesa in the longitudinal direction of the mesa. A portion of the first insulation layer disposed in the longitudinal direction of the mesa may be greater than the width of the second bonding pad and smaller than ½ of the maximum length of the mesa. With this structure, the light emitting diode can secure reliability under high humidity conditions while reducing light loss by the first insulation layer.

In other exemplary embodiments, the mesa may include a groove formed through the p-type semiconductor layer and the active layer to expose the n-type semiconductor layer, and the first insulation layer may cover a portion of a region of the p-type semiconductor layer disposed between the groove and the second bonding pad.

In other exemplary embodiments, the light emitting diode may further include an additional insulation layer separated from the first insulation layer, wherein the mesa may include a groove formed through the p-type semiconductor layer and the active layer to expose the n-type semiconductor layer, and the additional insulation layer may cover a portion of a region of the p-type semiconductor layer disposed between the groove and the second bonding pad.

The additional insulation layer may cover a portion of a sidewall of the groove.

The light emitting diode may further include a transparent electrode forming ohmic contact with the p-type semiconductor layer, wherein the second bonding pad may be disposed on the transparent electrode to be electrically connected to the transparent electrode.

In one exemplary embodiment, the transparent electrode may cover a portion of the first insulation layer.

Furthermore, the transparent electrode and the first insulation layer may overlap each other in a first width w1 and the transparent electrode may be separated from an edge of the p-type semiconductor layer by a second width w2, wherein the first width w1 is greater than the second width w2 and may be less than or equal to 10 μm. For example, the first width w1 may be 5 μm and the second width w2 may be 4 μm.

The light emitting diode may further include a first extension extending from the first bonding pad. The first extension is electrically connected to the n-type semiconductor layer. The first extension may be electrically connected to the n-type semiconductor layer through holes formed in the first insulation layer. Alternatively, the first insulation layer may include a plurality of islands separated from each other and the first extension may be electrically connected to the n-type semiconductor layer in a region between the islands.

In another exemplary embodiment, a portion of the first insulation layer may cover the transparent electrode. In another exemplary embodiment, a side surface of the first insulation layer and a side surface of the transparent electrode may be disposed to face each other.

In accordance with exemplary embodiments of the present disclosure, a light emitting device includes: an n-type semiconductor layer; a mesa disposed on the n-type semiconductor layer to expose a portion of an upper surface of the n-type semiconductor layer and including an active layer and a p-type semiconductor layer disposed on the active layer; a first bonding pad electrically connected to the n-type semiconductor layer; a second bonding pad electrically connected to the p-type semiconductor layer; a bonding wire bonded to the second bonding pad; and an anti-metal migration layer disposed between the exposed n-type semiconductor layer and the second bonding pad, wherein the anti-metal migration layer is separated from the second bonding pad to be opposite to the first bonding pad and is disposed along an edge of the p-type semiconductor layer disposed adjacent to the bonding wire.

A length of the anti-metal migration layer may be smaller than half the entire length of an edge of the mesa.

Under high humidity conditions, metal ions can be migrated from a metal wire disposed at an anode side toward a cathode side. As a result, the light emitting diode can suffer from current leakage and failure due to short circuit. However, with the anti-metal migration layer, the light emitting diode can prevent migration of metal ions, thereby preventing failure due to short circuit under high humidity conditions.

In one embodiment, the bonding wire may be a silver (Ag) wire.

In accordance with exemplary embodiments of the present disclosure, a light emitting device includes: a base; first and second leads disposed adjacent to the base; the light emitting diode mounted on the base; bonding wires electrically connecting the light emitting diode to the first and second leads; and a molding portion covering the light emitting diode and the bonding wires, wherein the light emitting diode includes a transparent electrode disposed on the p-type semiconductor layer, the bonding wires are bonded to the first and second bonding pads, respectively, and the molding portion adjoins the first and second bonding pads of the light emitting diode, the transparent electrode and the first insulation layer while partially adjoining the n-type semiconductor layer exposed by the mesa.

Furthermore, a contact area between the molding portion and the transparent is electrode may be larger than a contact area between the molding portion and other components of the light emitting diode.

Figure 2A:
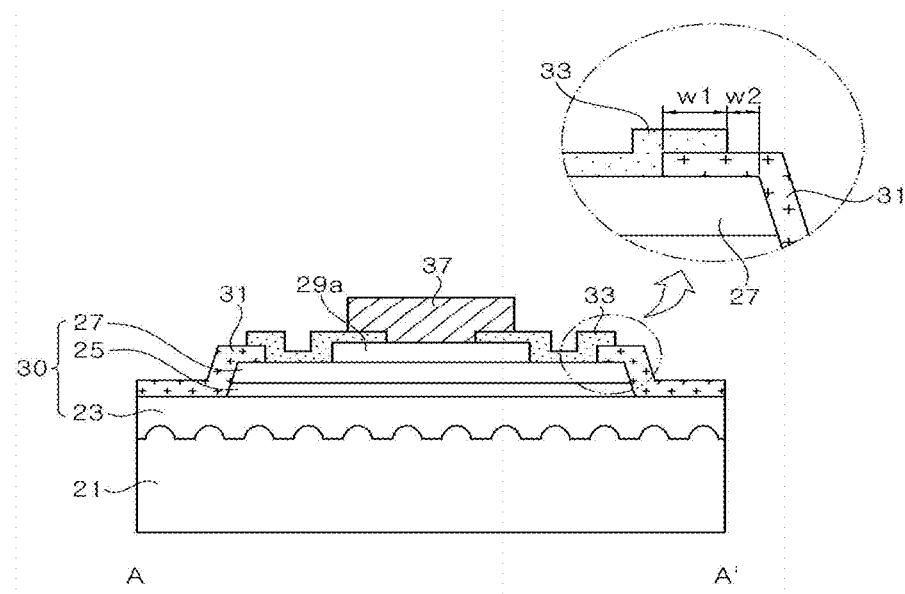
FIG. 2A, FIG. 2B, and FIG. 2C are cross-sectional views taken along lines A-A', B-B', and C-C' of FIG. 1, respectively.
Figure 2B:
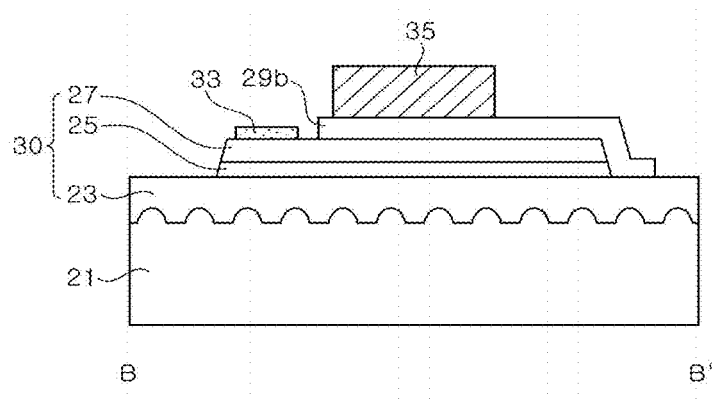
Figure 2C:
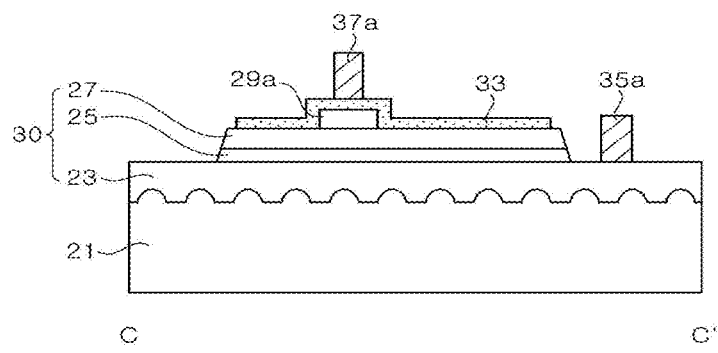

FIG. 1 is a schematic plan view of a light emitting diode according to an exemplary embodiment, and FIG. 2A, FIG. 2B, and FIG. 2C are cross-sectional views taken along lines A-A', B-B' and C-C' of FIG. 1, respectively.

Referring to FIG. 1, FIG. 2A, FIG. 2B and FIG. 2C, a light emitting diode 100 may include a substrate 21, a light emitting structure 30 including a mesa M, a current barrier layer 29a, a current blocking layer 29b, a first insulation layer 31, a transparent electrode 33, a first bonding pad 35, a first extension 35a, a second bonding pad 37, and a second extension 37a.

The substrate 21 may be an insulating or conductive substrate. In addition, the substrate 21 may be a growth substrate for growth of the light emitting structure 30, and may include a sapphire substrate, a silicon carbide substrate, a silicon substrate, a gallium nitride substrate, an aluminum nitride substrate, or others. For example, the substrate 21 may be a sapphire substrate, particularly a patterned sapphire substrate (PSS). The substrate 21 may include a plurality of bumps formed on an upper surface thereof. The substrate 21 may generally have an elongated rectangular shape, without being limited thereto.

The light emitting structure 30 including the mesa M is disposed on the substrate 21. The light emitting structure 30 includes an n-type semiconductor layer 23, a p-type semiconductor layer 27 disposed on the n-type semiconductor layer 23, and an active layer 25 disposed between the n-type semiconductor layer 23 and the p-type semiconductor layer 27. The mesa M includes the p-type semiconductor layer 27 and the active layer 25.

The n-type semiconductor layer 23, the active layer 25, and the p-type semiconductor layer 27 may be grown on the substrate 21 in a chamber by a well-known method in the art, such as MBE (molecular beam epitaxy), MOCVD (metal organic chemical vapor deposition), or others. The n-type semiconductor layer 23 may be diced together with the substrate 21 to have substantially the same plane shape as the substrate 21, without being limited thereto. Alternatively, the n-type semiconductor layer 23 may be disposed in some region of the substrate 21.

The n-type semiconductor layer 23, the active layer 25, and the p-type semiconductor layer 27 may include III-V based nitride semiconductors, for example, a nitride semiconductor, such as (Al, Ga, In)N. The n-type semiconductor layer 23 may include n-type dopants (for example, Si, Ge, Sn, and the like) and the p-type semiconductor layer 27 may include p-type dopants (for example, Mg, Sr, Ba, and the like). The active layer 25 may have a single quantum well structure or a multi-quantum well (MQW) structure, and the composition of the nitride semiconductor for the active layer may be regulated to allow the active layer to emit light having a predetermined wavelength.

The mesa M is disposed in some region of the n-type semiconductor layer 23, such that an upper surface of the n-type semiconductor layer 23 is exposed in a region in which the mesa M is not formed. The mesa M may be formed by growing the n-type semiconductor layer 23, the active layer 25, and the p-type semiconductor layer 27 on the substrate 21, followed by partially etching the p-type semiconductor layer 27 and the active layer 25, for example. The mesa M may have a substantially similar shape to the substrate 21, without being limited thereto. More particularly, the mesa M may have a substantially rectangular shape that is elongated in one direction (longitudinal direction), as shown in FIG. 1. Further, the mesa M may have an inclined side surface, without being limited thereto. Alternatively, the mesa M may have a side surface perpendicular to the upper surface of the n-type semiconductor layer 23. In the illustrated exemplary embodiment, the mesa M may include an indented portion formed on one side surface thereof to place the first extension 35a described below thereon.

In addition, the mesa M may further include a concavo-convex pattern formed on the side surface thereof. The concavo-convex pattern may be formed by dry etching and/or wet etching. The concavo-convex pattern improves efficiency in extraction of light generated from the active layer 25.

The transparent electrode 33 may be disposed on the p-type semiconductor layer 27, and may form ohmic contact with the p-type semiconductor layer 27. The transparent electrode 33 may include a material having light transmittance and electrical conductivity, such as a conductive oxide or a light transmissive metal layer. For example, the transparent electrode 33 may include at least one of ITO (Indium Tin Oxide), ZnO (Zinc Oxide), ZITO (Zinc Indium Tin Oxide), ZIO (Zinc Indium Oxide), ZTO (Zinc Tin Oxide), GITO (Gallium Iridium Tin Oxide), GIO (Gallium Indium Oxide), GZO (Gallium Zinc Oxide), AZO (Aluminum doped Zinc Oxide), FTO (Fluorine Tin Oxide), or a Ni/Au stacked structure.

The first bonding pad 35 may be disposed on the mesa M. The first bonding pad 35 is electrically insulated from the p-type semiconductor layer 27. To this end, the current blocking layer 29b may be disposed between the first bonding pad 35 and the p-type semiconductor layer 27. In addition, the current blocking layer 29b may partially cover the side surface of the mesa M and the n-type semiconductor layer 23, which are exposed around the first bonding pad 35. The current blocking layer 29b electrically insulates the first bonding pad 35 from the p-type semiconductor layer 27 while preventing the bonding wire disposed on the first bonding pad 35 from short circuiting with the transparent electrode 33 or the p-type semiconductor layer 27.

The first extension 35a may extend from the first bonding pad 35. The first extension 35a may extend to an upper surface of the exposed n-type semiconductor layer 23 to contact the n-type semiconductor layer 23. The first extension 35a and the first bonding pad 35 may be formed of substantially the same material by the same process. The first extension 35a contacts the n-type semiconductor layer 23 over a broad area to assist in current spreading.

The second bonding pad 37 may be disposed on the mesa M. As shown in the drawings, the second bonding pad 37 may be disposed near a distal end of the mesa M at one side thereof in the longitudinal direction of the mesa M, so as to be opposite to the first bonding pad 35. The second bonding pad 37 is separated from edges of the mesa M such that a portion of the mesa M is disposed between the second bonding pad 37 and the n-type semiconductor layer 23 exposed around the mesa M.

The second extension 37a extends from the second bonding pad 37 towards the first bonding pad 35. The second extension 37a and the second bonding pad 37 may be formed of substantially the same material by the same process. Here, the second bonding pad 37 has a larger width than the second extension 37a to form a wire ball so as to act as a pad for wire bonding.

The second bonding pad 37 may include a metallic material, for example, Ti, Pt, Au, Cr, Ni, Al, and the like, and may have a single layer or multilayer structure. For example, the second bonding pad 37 may include at least one stacked structures of Ti layer/Au layer, Ti layer/Pt layer/Au layer, Cr layer/Au layer, Cr layer/Pt layer/Au layer, Ni layer/Au layer, Ni layer/Pt layer/Au layer, and Cr layer/Al layer/Cr layer/Ni layer/Au layer. The second bonding pad 37 may be formed of substantially the same material as the first bonding pad 35.

The current barrier layer 29a may be disposed under the second bonding pad 37 is and the second extension 37a. In particular, the current barrier layer 29a may be disposed between the p-type semiconductor layer 27 and the transparent electrode 33. The current barrier layer 29a may prevent electric current supplied through the second bonding pad 37 from crowding around the second bonding pad 37 or the second extension 37a. Accordingly, the current barrier layer 29a may include an insulating material and may have a single layer or a multi-layer structure. For example, the current barrier layer 29a may include $SiO_x$ or $SiN_x$, or may include a distributed Bragg reflector, in which insulating material layers having different refractive indices are stacked one above another. The current barrier layer 29a may have light transmittance or light reflectance. Alternatively, the current barrier layer 29a may have selective reflectance.

In addition, the current barrier layer 29a may have a larger area than the second bonding pad 37 and the second extension 37a such that the second bonding pad 37 and the second extension 37a are restrictively disposed on the current barrier layer 29a.

As shown in FIG. 2A, the transparent electrode 33 may have an opening, which is disposed under the second bonding pad 37 and exposes the current barrier layer 29a, such that the second bonding pad 37 can contact the current barrier layer 29a therethrough.

The first insulation layer 31 covers a portion of a region of the p-type semiconductor layer 27 between the second bonding pad 37 and the n-type semiconductor layer 23 exposed around the mesa M. The first insulation layer 31 is partially disposed along the edge of the mesa M. In particular, the first insulation layer 31 may be disposed in an elongated shape along an edge of the p-type semiconductor layer 27 while partially covering a region of the p-type semiconductor layer 27 between the second bonding pad 37 and a portion of the exposed region of the n-type semiconductor layer 23, which is exposed by the mesa M and disposed is closest to the second bonding pad 37. In addition, as shown in FIG. 1, the first insulation layer 31 may be disposed to surround three sides of the second bonding pad 37. Further, the first insulation layer 31 may partially cover the side surface of the mesa M and the exposed region of the n-type semiconductor layer 23, as shown in FIG. 1 and FIG. 2A. In general, the first insulation layer 31 may be formed at a location separated from the second bonding pad 37 and facing the first bonding pad 35, for example, at an opposite side of the first bonding pad 35.

The first insulation layer 31 is disposed to block migration of metal ions from a bonding wire to be formed on the second bonding pad 37 due to an electromagnetic field. As such, the first insulation layer 31 may be referred to as an anti-metal migration layer. Under high humidity conditions, a moisture is formed on the transparent electrode 33 and allows metal ions to migrate from the second bonding pad 37 to the n-type semiconductor layer 23 therethrough. Since a stronger electromagnetic field is generated with decreasing distance between the second bonding pad 37 and the exposed n-type semiconductor layer 23, the first insulation layer 31 may need to be formed at a portion closest to a migration path of metal ions. Furthermore, the first insulation layer 31 is disposed in an elongated shape so as to sufficiently block the migration path of the metal ions. As such, the first insulation layer 31 may be formed to have a greater width than the second bonding pad 37.

On the other hand, since the first insulation layer 31 can deteriorate light output, the first insulation layer 31 is restrictively formed in some region. In particular, the entire length of the first insulation layer 31 may be smaller than half (½) the entire length of the edge of the mesa M, and in some exemplary embodiments, a quarter (¼) of the entire length thereof. By regulating the entire length of the first insulation layer 31, the light emitting diode can reduce light loss due to the first insulation layer 31. However, the inventive concepts are not limited thereto. For example, in some exemplary embodiments, the first insulation layer 31 may cover most of the edge of the mesa M and may be connected to the current blocking layer 29b.

The transparent electrode 33 may cover a portion of the first insulation layer 31, as shown in FIG. 2A. More particularly, the first insulation layer 31 may be disposed under the transparent electrode 33. As shown in a partially enlarged cross-sectional view of FIG. 2A, the first insulation layer 31 and the transparent electrode 33 may overlap each other in a first width w1. On the other hand, the transparent electrode 33 may be separated from the edge of the p-type semiconductor layer 27 by a second width w2. Generally, the transparent electrode 33 is separated from the edge of the p-type semiconductor layer 27, and the second width w2 may be, for example, about 4 µm. In order to efficiently prevent metal ions from migrating to a region under the first insulation layer 31, the transparent electrode 33 and the first insulation layer 31 may sufficiently overlap each other. Accordingly, the first width w1 is greater than the second width w2, and may be, for example, about 5 µm or more. On the other hand, the upper limit of the second width w2 may be restricted to allow current spreading near the edge of the p-type semiconductor layer 27. For example, the second width w2 may be less than 10 µm.

The first insulation layer 31 may be formed together with the current barrier layer 29a and the current blocking layer 29b before formation of the transparent electrode 33. However, the inventive concepts are not limited thereto. For example, in some exemplary embodiments, the first insulation layer 31 may be formed of a different material from the current barrier layer 29a and the current blocking layer 29b. The first insulation layer 31 may be formed of, for example, silicon oxide or silicon nitride.

In the illustrated exemplary embodiment, insulation layers disposed on the p-type semiconductor layer 27 may be restricted to the current barrier layer 29a, the current blocking layer 29b, and the first insulation layer 31. Accordingly, most of the p-type semiconductor layer 27 is not covered by other material layers, excluding the transparent electrode 33, thereby reducing light loss from the insulation layers.

In addition, a protective layer may cover transparent electrode 33 in a conventional technique, whereby no insulation layer is disposed on the transparent electrode 33 in the illustrated exemplary embodiment. However, the inventive concepts are not limited thereto. As will be described more below, in some exemplary embodiments, a portion of the first insulation layer 31 may cover the transparent electrode 33.

FIG. 3 to FIG. 8 are schematic cross-sectional views and plan views of a light emitting diode according to exemplary embodiments. The light emitting diode shown in FIGS. 3 to 8 are substantially similar to the light emitting diode 100 described above. As such, repeated descriptions of the substantially the same elements of the light emitting diode will be omitted to avoid redundancy.

Figure 3:
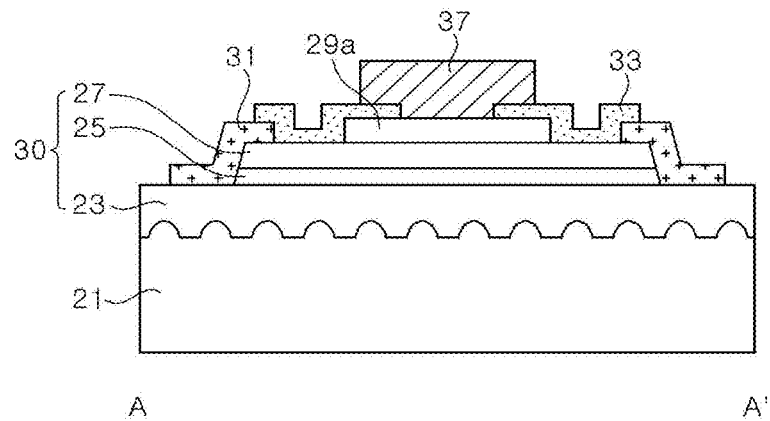
FIG. 3 is a schematic cross-sectional view of a light emitting diode according to another exemplary embodiment.

Referring back to FIG. 2A, the first insulation layer 31 of the light emitting diode 101 extends to the edge of the n-type semiconductor layer 23 exposed around the mesa M. Referring to FIG. 3, the first insulation layer 31 according to the illustrated exemplary embodiment partially covers the exposed n-type semiconductor layer 23 while exposing a region of the n-type semiconductor layer 23 near the edge thereof. Since the first insulation layer 31 is separated from the edge of the n-type semiconductor layer 23, the first insulation layer 31 is prevented from being damaged during a dicing process for separation of the light emitting diode.

Figure 4:
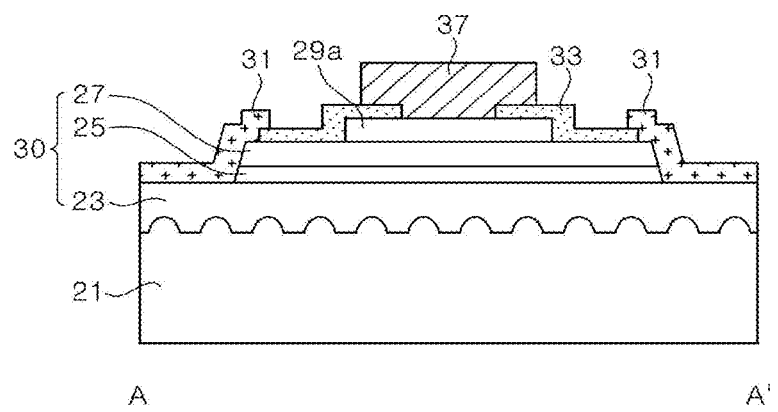
FIG. 4 is a schematic cross-sectional view of a light emitting diode according to another exemplary embodiment.

Referring to FIG. 4, a portion of the first insulation layer 31 according to the illustrated exemplary embodiment covers the transparent electrode 33. Accordingly, the first insulation layer 31 may be formed after formation of the transparent electrode 33. Since the first insulation layer 31 covers the transparent electrode 33, migration of metal ions from the second bonding pad 37 to the n-type semiconductor layer 23 can be more efficiently blocked.

Figure 5:
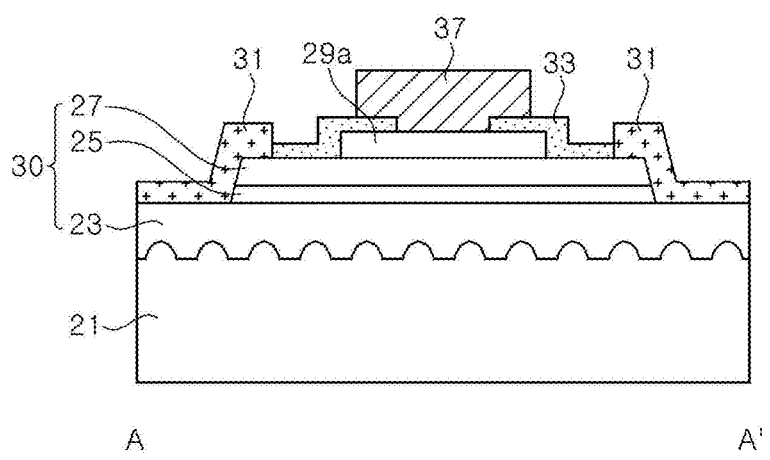
FIG. 5 is a schematic cross-sectional view of a light emitting diode according to another exemplary embodiment.

Referring to FIG. 5, a side surface of the first insulation layer 31 according to the illustrated exemplary embodiment is disposed to face a side surface of the transparent electrode 33. Accordingly, the first insulation layer 31 and the transparent electrode 33 do not overlap each other. The side surface of the first insulation layer 31 may adjoin the side surface of the transparent electrode 33, but is not limited thereto. Alternatively, the side surface of the first insulation layer 31 may be separated from the transparent electrode 33.

Figure 6:
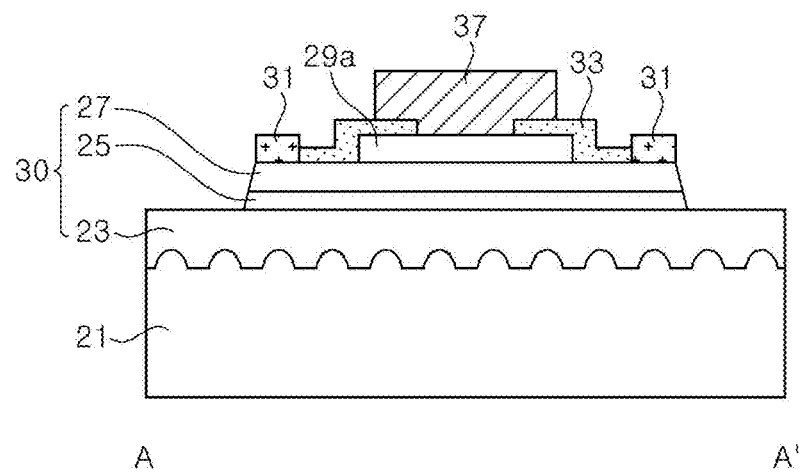
FIG. 6 is a schematic cross-sectional view of a light emitting diode according to another exemplary embodiment.

Referring to FIG. 6, the first insulation layer 31 according to the illustrated exemplary embodiment is restrictively disposed on the p-type semiconductor layer 27, and may not cover the side surface of the mesa M or the exposed n-type semiconductor layer 23. Although the first insulation layer 31 is illustrated as being disposed so as not to overlap the transparent electrode 33, in some exemplary embodiments, at least part of the first insulation layer 31 may be disposed on or under the transparent electrode 33.

Figure 7A:
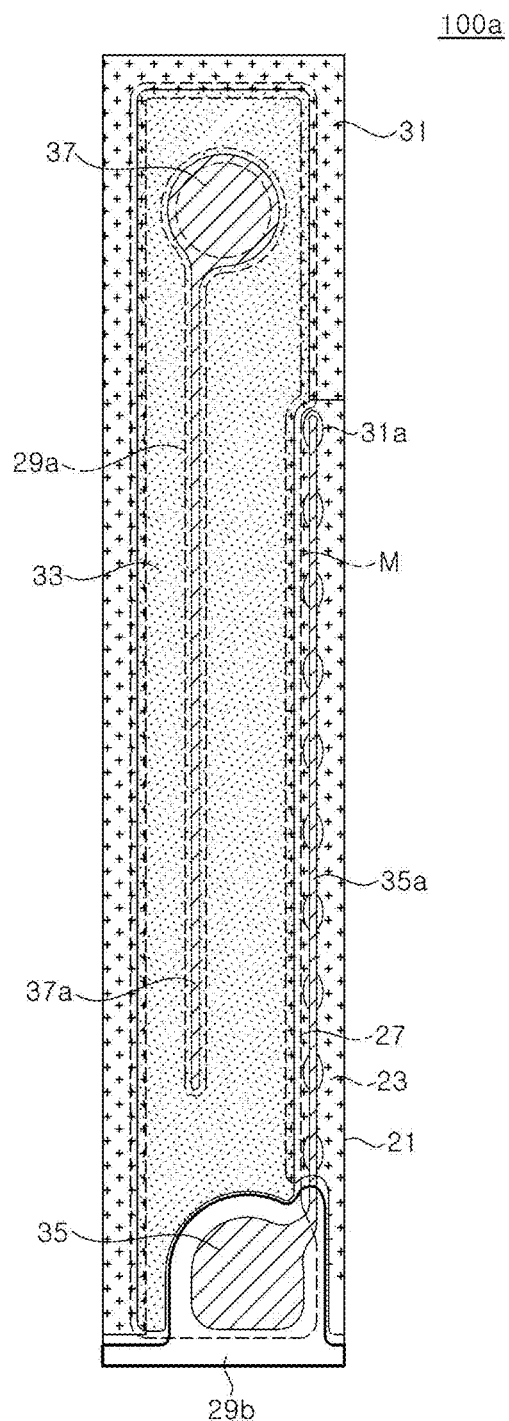
FIGS. 7A, 7B, and 7C are plan view of a light emitting diode according to exemplary embodiments.
Figure 7B:
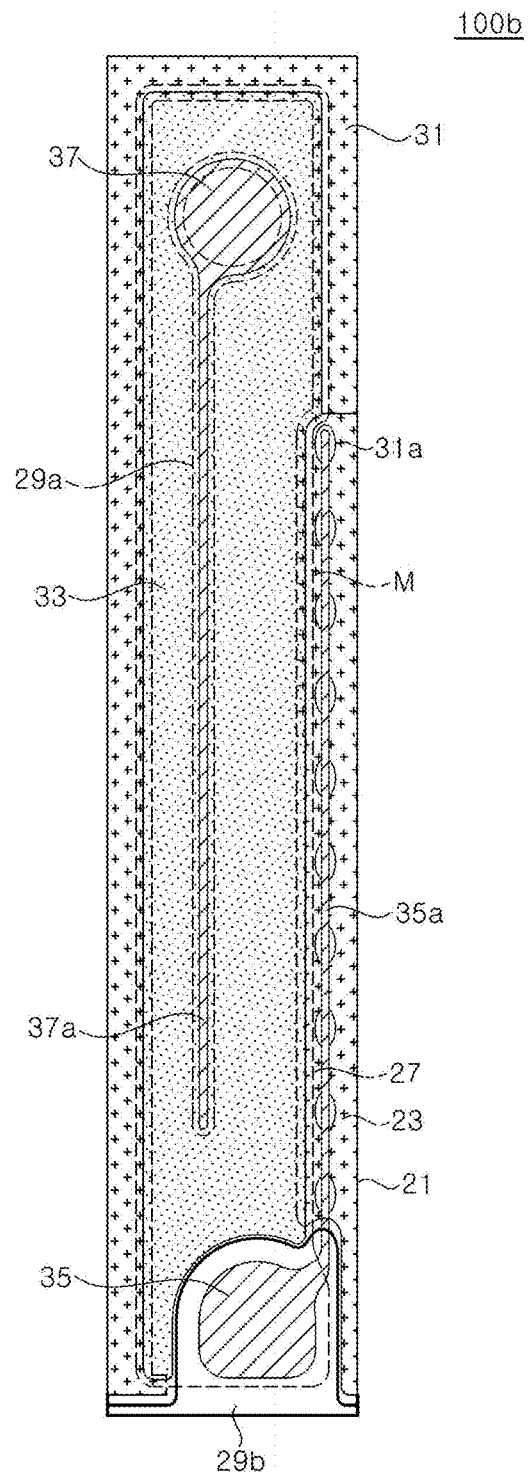
Figure 7C:
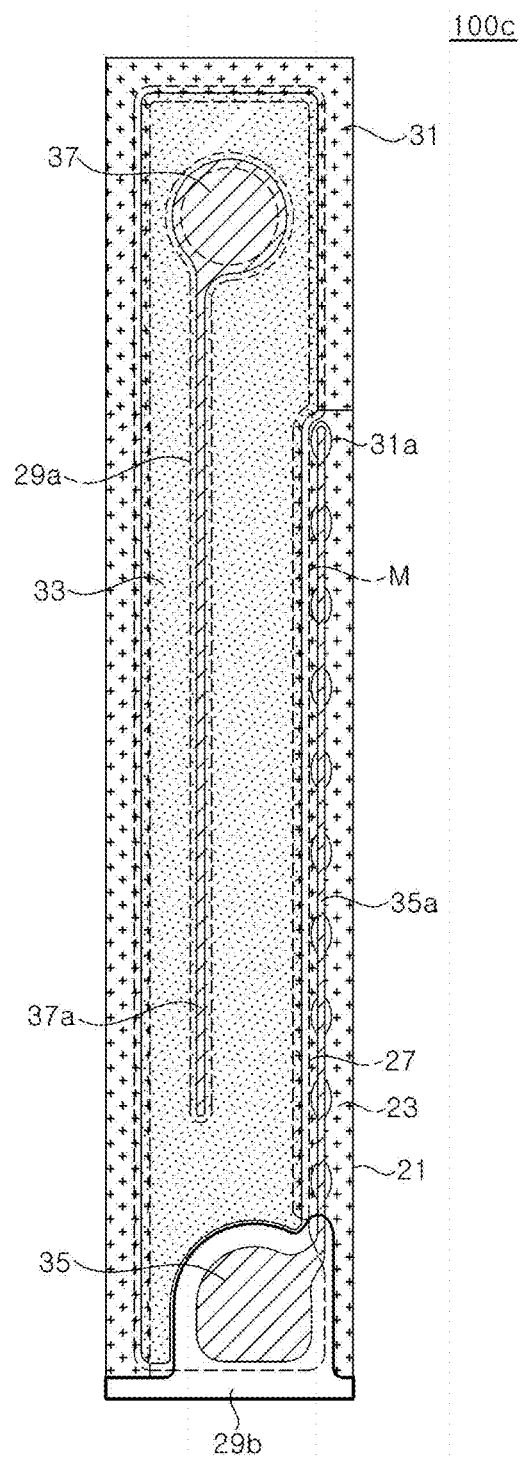

FIG. 7A, FIG. 7B, and FIG. 7C are schematic plan views of a light emitting diode according to exemplary embodiments.

Referring to FIG. 7A, a light emitting diode 100a according to the illustrated exemplary embodiment is generally similar to the light emitting diode of FIG. 1, except that the first insulation layer 31 further extends along the edge of the mesa M.

The first insulation layer 31 may extend to a portion near the current blocking layer 29b along both edges of the mesa M. The first insulation layer 31 may overlap the transparent electrode 33 in a substantially constant width w1, which may range from 5 µm to 10 µm, more specifically about 5 µm. Further, the first insulation layer 31 may be separated from the current blocking layer 29b by a distance of about 2 µm to 5 µm.

In the illustrated exemplary embodiment, the current blocking layer 29b is separated from the transparent electrode 33. However, in some exemplary embodiments, the current blocking layer 29b may overlap the transparent electrode 33.

The first insulation layer 31 covers the n-type semiconductor layer 23 exposed near the mesa M, such that the first extension 35a passes above the first insulation layer 31. As shown in the drawing, the first insulation layer 31 may include a plurality of openings 31a that expose the n-type semiconductor layer 23, such that the first extension 35a can be electrically connected to the n-type semiconductor layer 23 through the plurality of openings 31a. The openings 31a may be arranged at constant intervals, without being limited thereto. Alternatively, the openings 31a may be arranged at different intervals. For example, the openings 31a may be arranged to have intervals gradually decreasing with increasing distance from the first bonding pad 35, thereby providing more uniform current spreading.

Referring to FIG. 7B, a light emitting diode 100b according to the illustrated exemplary embodiment is generally similar to the light emitting diode 100a of FIG. 1, except that the first insulation layer 31 further includes a protrusion formed at a left distal end thereof and protruding towards the current blocking layer 29b. In this manner, the light emitting diode 100b can secure as large an overlap area between the transparent electrode 33 and the first insulation layer 31 as possible.

Referring to FIG. 7C, a light emitting diode 100c according to the illustrated exemplary embodiment is generally similar to the light emitting diode 100a of FIG. 1, except that the first insulation layer 31 extends to the current blocking layer 29b to be connected thereto. The first insulation layer 31 and the current blocking layer 29b may be formed of substantially the same material by the same process and are connected to each other, thereby simplifying manufacturing process.

Figure 8:
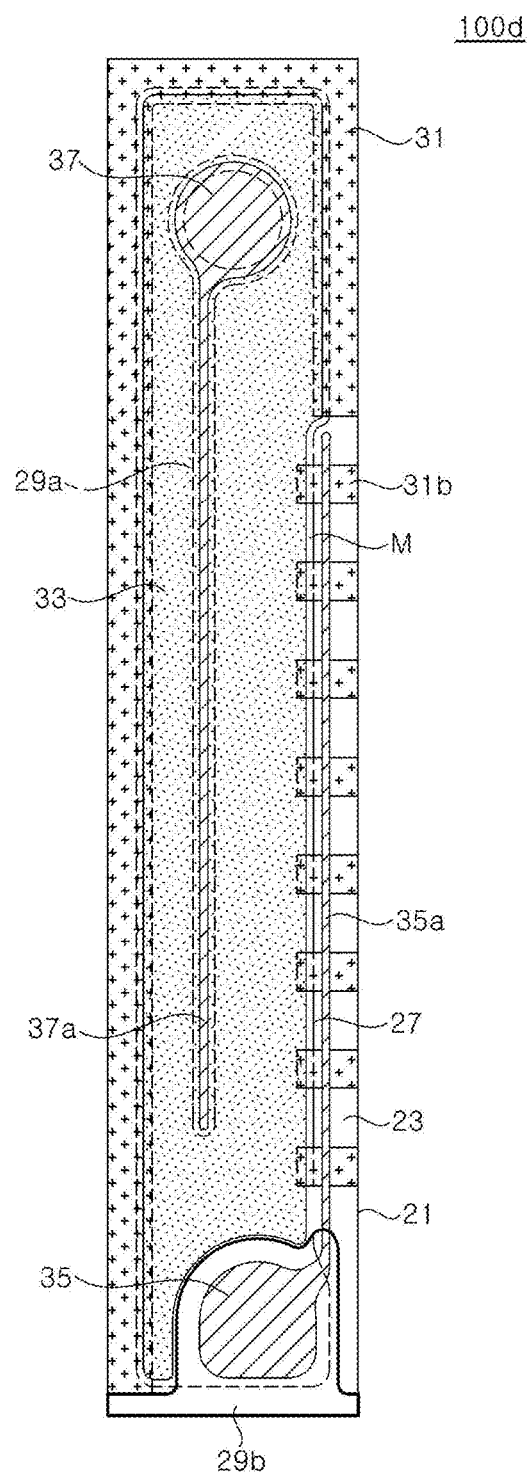
FIG. 8 is a schematic plan view of a light emitting diode according to an exemplary embodiment.

FIG. 8 is a schematic plan view of a light emitting diode according to another exemplary embodiment.

Referring to FIG. 8, a light emitting diode 100d according to the illustrated exemplary embodiment is generally similar to the light emitting diode 100c of FIG. 7C, except that the first insulation layer 31 is patterned with a plurality of islands 31b, instead of having the plurality of openings 31a.

The islands 31b are arranged along the first extension 35a under the first extension 35a. Accordingly, the first extension 35a may be electrically connected to the n-type semiconductor layer 23 exposed between the islands 31b.

The islands 31b may overlap the transparent electrode 33 in the first width w1 as in the first insulation layer 31. The islands 31b may have various shapes, such as a shape having an inclined side surface. In this manner, the first extension 35a can be prevented from being disconnected on the side surface of the islands 31b.

Further, although the left distal end of the first insulation layer 31 is connected to the current blocking layer 29b in FIG. 8, the left distal end of the first insulation layer 31 may be separated therefrom by a distance of about 2 μm to about 5 μm, as those shown in FIG. 7A and FIG. 7B.

It should be noted that the above modifications shown in FIG. 3 to FIG. 5 may also be applied to the modifications shown in FIG. 7A, FIG. 7B, FIG. 7C, and FIG. 8. Further, the modifications illustrated in FIG. 3 to FIG. 8 may also be applied to various exemplary embodiments described below.

Figure 9:
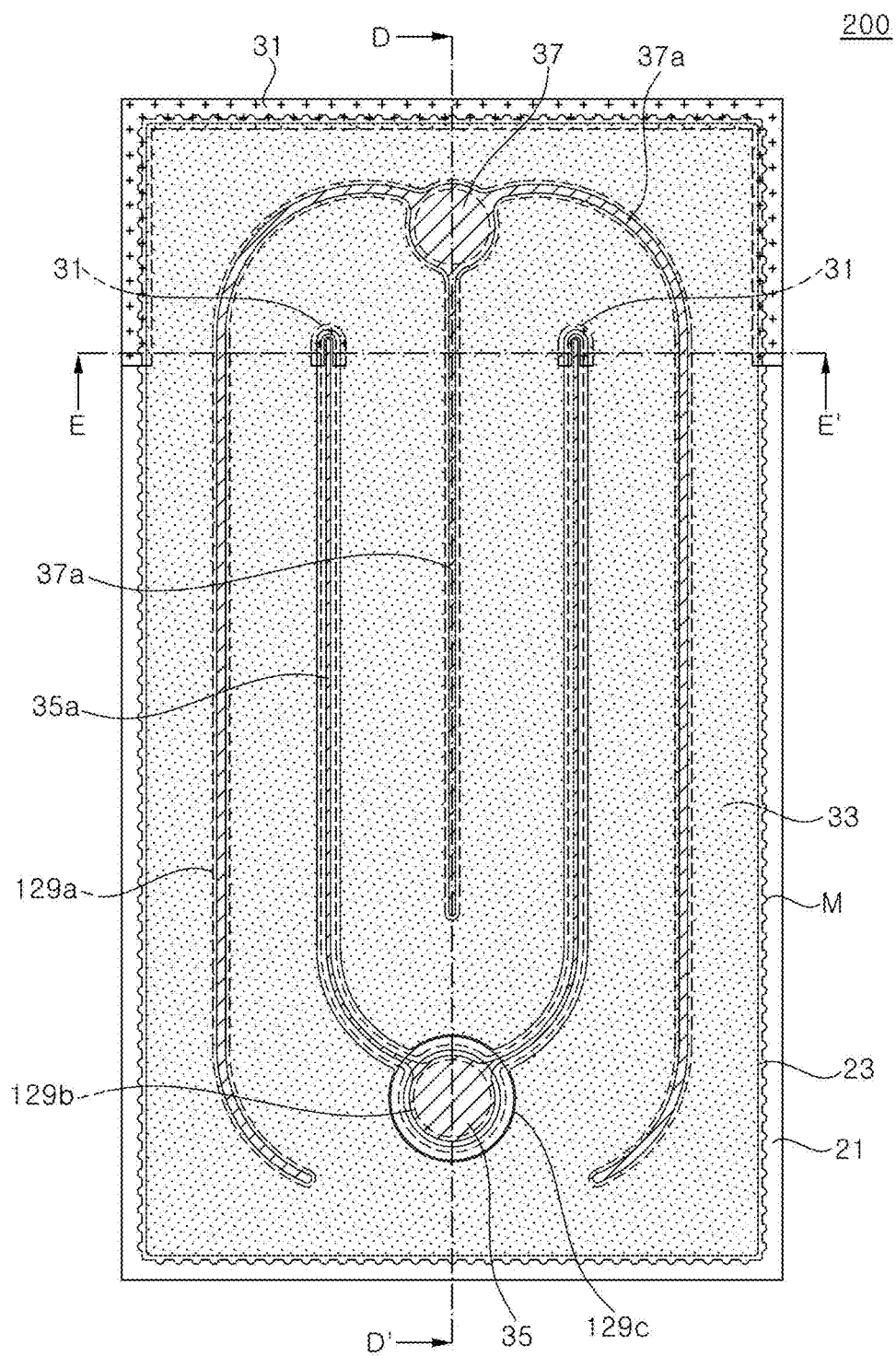
FIG. 9 is a schematic plan view of a light emitting diode according to another exemplary embodiment.
Figure 10A:
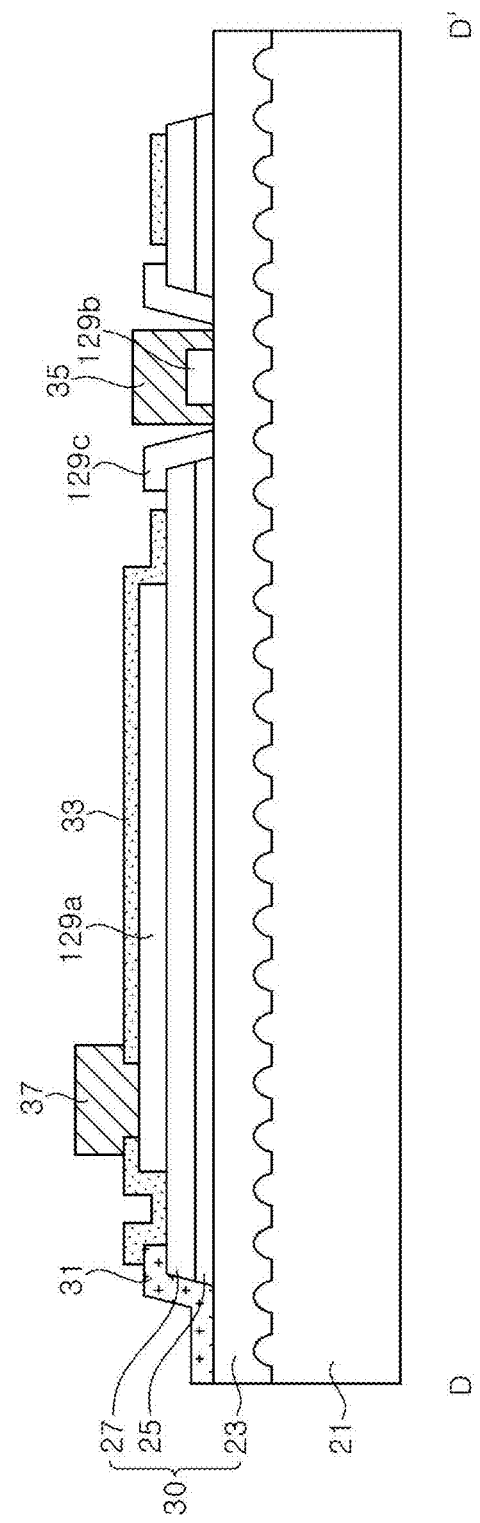
FIG. 10A and FIG. 10B are cross-sectional views taken along lines D-D' and E-E' of FIG. 9, respectively.
Figure 10B:
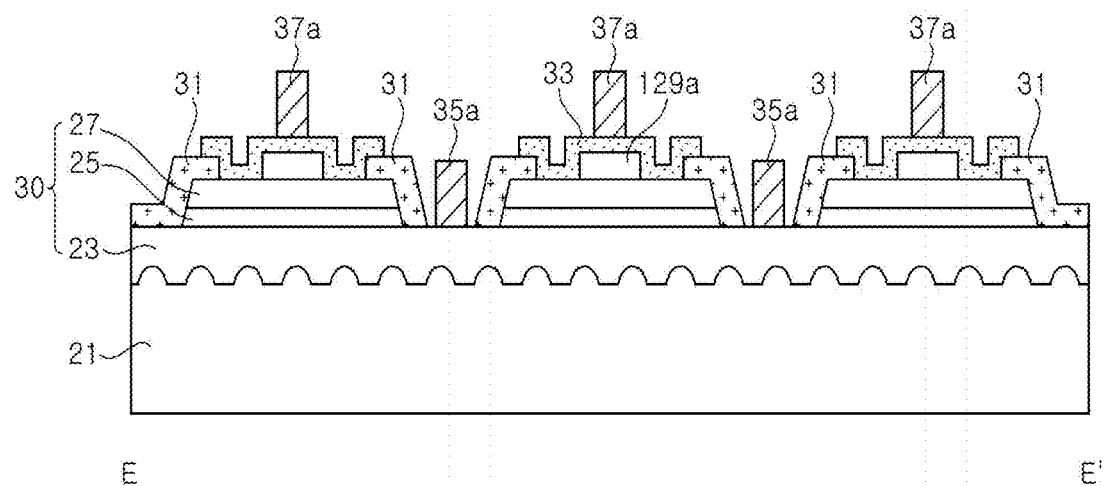

FIG. 9 is a schematic plan view of a light emitting diode 200 according to another exemplary embodiment, and FIG. 10A and FIG. 10B are cross-sectional views taken along lines D-D' and E-E' of FIG. 9, respectively.

Referring to FIG. 9, FIG. 10A, and FIG. 10B, the light emitting diode 200 according to the illustrated exemplary embodiment is generally similar to the light emitting diode 100 described above, except that the light emitting diode 200 has a larger light emitting area, and thus, include a greater number of extensions 35a, 37b than the light emitting diode 100. Further, the light emitting diode 100 includes the first bonding pad 35 disposed on the p-type semiconductor layer 27, whereas the light emitting diode 200 includes a first bonding pad 35 disposed in a groove formed on the mesa M.

The mesa M is disposed in some region of the n-type semiconductor layer 23 so as to expose the upper surface of the n-type semiconductor layer 23 along the mesa M. The mesa M may have an elongated rectangular shape, and may include a concavo-convex pattern on the side surface thereof, as shown in the drawings.

The mesa M may include a groove exposing the n-type semiconductor layer 23, and the first bonding pad 35 may be disposed in the groove. The light emitting diode 200 according to the illustrated exemplary embodiment includes first extensions 35a extending from the first bonding pad 35 towards a second bonding pad 37.

The second bonding pad 37 is disposed near a distal end of the mesa M at one side thereof in the longitudinal direction of the mesa M (at one side perpendicular to the longitudinal direction thereof) so as to be opposite to the first bonding pad 35. In the illustrated exemplary embodiment, a portion of the exposed region of the n-type semiconductor layer 23 placed nearest to the second bonding pad 37 may be disposed near the distal end of the mesa M.

The first insulation layer 31 covers some region of the p-type semiconductor layer 27 between the second bonding pad 37 and the exposed n-type semiconductor layer 23. More particularly, the first insulation layer 31 may extend along an edge of the mesa M while covering a portion of the p-type semiconductor layer 27 between the second bonding pad 37 and the portion of the exposed region of the n-type semiconductor layer 23 disposed nearest the second bonding pad 37. The first insulation layer 31 has a greater length than the width of the second bonding pad 37. The first insulation layer 31 may also extend along edges of the mesa parallel to the longitudinal direction thereof, so as to surround three sides of the second bonding pad 37, without being limited thereto. Alternatively, the edges of the mesa parallel to the longitudinal direction may not be covered by the first insulation layer 31. For example, when the edges of the mesa M parallel to the longitudinal direction thereof are farther apart from the second bonding pad 37, the light emitting diode may not suffer from short circuit even without the first insulation layer 31. In this manner, the first insulation layer 31 may be disposed only near the distal end of the mesa at one side of the mesa perpendicular to the longitudinal direction thereof.

The n-type semiconductor layer 23 is exposed through the grooves for formation of the first extensions 35a, and a relatively strong electric field may be generated between the n-type semiconductor layer 23 exposed through the grooves and the second bonding pad 37. Accordingly, the first insulation layer 31 may cover a portion of the p-type semiconductor layer 27 disposed between the grooves and the second bonding pad 37. When the second bonding pad 37 is disposed closer to the grooves than the n-type semiconductor layer 23 exposed along the periphery of the mesa M, in some exemplary embodiment, the first insulation layer 31 disposed near the edge of the mesa M may be omitted and may be placed only near the grooves.

A current barrier layer 129a may be disposed under the second bonding pad 37 and the second extension 37a, and may also be disposed below the transparent electrode 33, as in the current barrier layer 29a described above.

In addition, a current barrier layer 129b may be partially disposed in a region under the first bonding pad 35, and may cover sidewalls of the grooves around the first bonding pad 35.

Although the first insulation layer 31 is illustrated as being disposed under the transparent electrode 33 and extending to an edge of the exposed n-type semiconductor layer 23 in the illustrated exemplary embodiment, however, the inventive concepts are not limited thereto, and the structure thereof shown in FIG. 3 to FIG. 6 may be applied.

Figure 11:
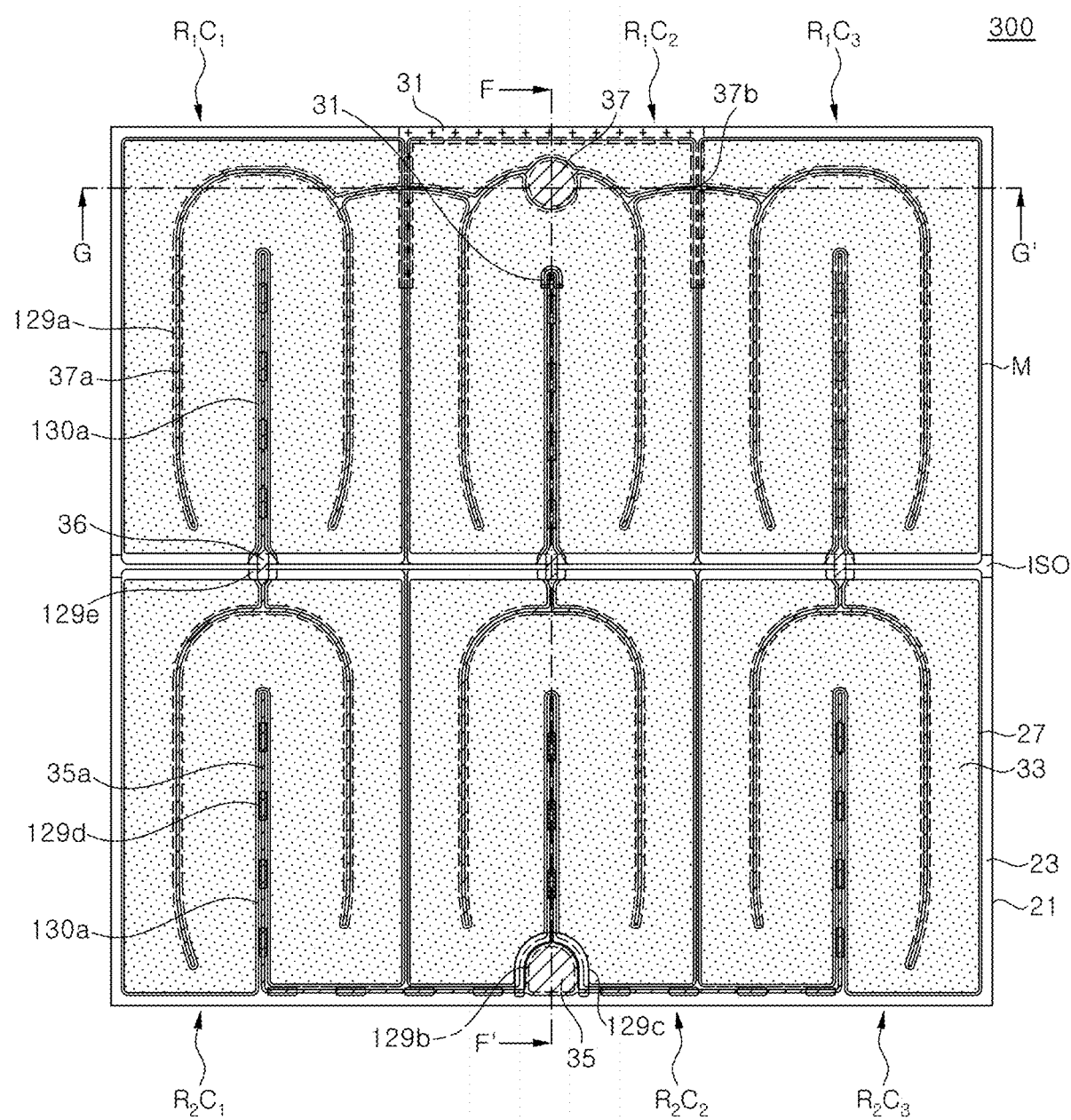
FIG. 11 is a schematic plan view of a light emitting diode according to another exemplary embodiment.
Figure 12A:
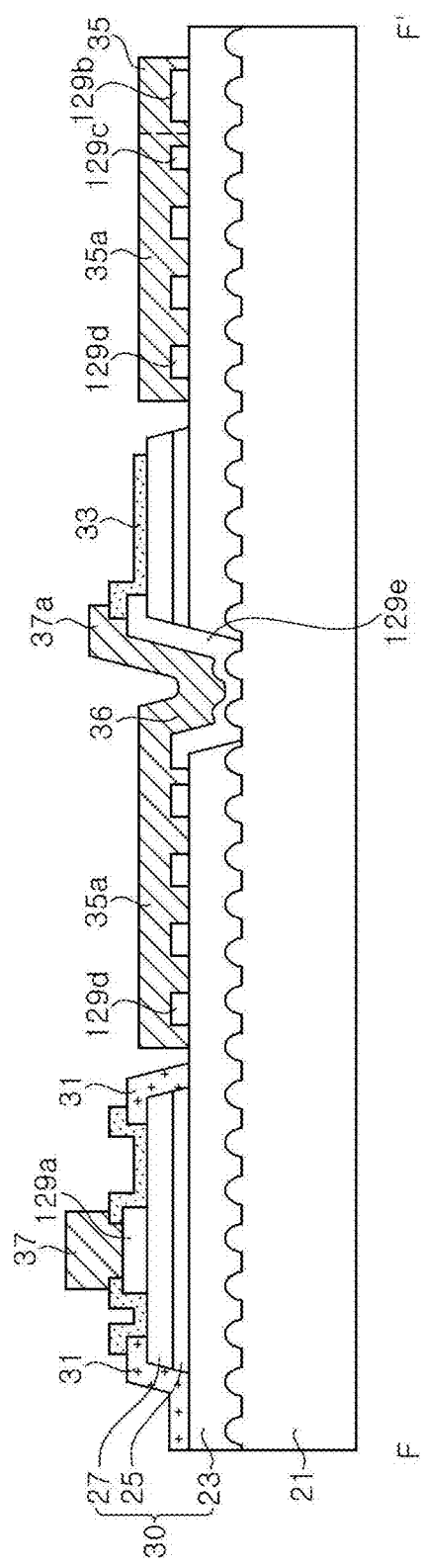
FIG. 12A and FIG. 12B are cross-sectional views taken along lines F-F' and G-G' of FIG. 11, respectively.
Figure 12B:
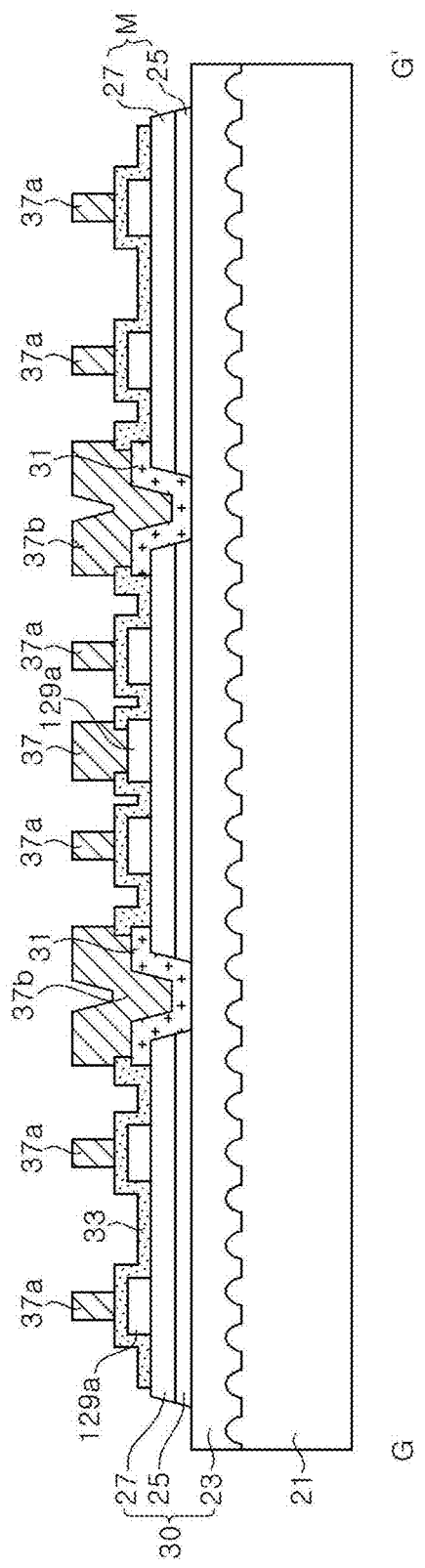

FIG. 11 is a schematic plan view of a light emitting diode 300 according to a further exemplary embodiment, and FIG. 12A and FIG. 12B are cross-sectional views taken along lines F-F' and G-G' of FIG. 11, respectively.

Referring to FIG. 11, FIG. 12A, and FIG. 12B, the light emitting diode 300 is generally similar to the light emitting diode 200 described above with reference to FIG. 9, except that the light emitting diode 300 includes a plurality of light emitting cells R1C1 to R2C3 disposed on a substrate 21 to be electrically connected to one another. The following descriptions will be focused on different features of the light emitting diode 300 to avoid redundancy.

Referring to FIG. 11, the substrate 21 may have a substantially rectangular or square shape. In the above exemplary embodiments, the substrate 21 generally has an elongated shape, whereas the substrate 21 according to the illustrated exemplary embodiment has a substantially square shape. However, the inventive concepts are not limited thereto a particular size and shape of the substrate 21.

The plural light emitting cells R1C1 to R2C3 are disposed on the substrate 21. Each of the light emitting cells includes an n-type semiconductor layer 23 and a mesa M disposed on the n-type semiconductor layer 23. As described above, the mesa M includes an active layer 25 and a p-type semiconductor layer 27, and has a smaller area than the n-type semiconductor layer 23.

The plural light emitting cells R1C1 to R2C3 may be arranged in a matrix via a mesa etched region and a cell isolation region ISO. Although the light emitting cells are arranged in a 2×3 matrix in the illustrated exemplary embodiment, the inventive concepts are not limited thereto, and in some exemplary embodiments, the light emitting cells may be arranged in 2×2 matrix, for example.

Light emitting cells arranged on the same row may share the n-type semiconductor layer 23. For example, light emitting cells R1C1, R1C2, R1C3 arranged on the first row may share one n-type semiconductor layer 23, and light emitting cells R2C1, R2C2, R2C3 arranged on the second row may share one n-type semiconductor layer 23.

On the other hand, the light emitting cells arranged on the same column may have n-type semiconductor layers 23 separated from each other. For example, the n-type semiconductor layers 23 of the light emitting cells R1C1 and R2C1 arranged on the first column are isolated from each other by the cell isolation region ISO, the n-type semiconductor layers 23 of the light emitting cells R1C2 and R2C2 arranged on the second column are also separated from each other by the cell isolation region ISO, and the n-type semiconductor layers 23 of the light emitting cells R1C3 and R2C3 arranged on the third column are also isolated from each other by the cell isolation region ISO.

In this manner, the light emitting cells arranged on the same row may share the n-type semiconductor layer 23, thereby preventing current crowding along a particular column. More particularly, even when current crowding occurs through a certain light emitting cell in a row, electric current can be distributed again through the n-type semiconductor layer 23 shared by the light emitting cells, thereby supplying electric current to the light emitting cells in the next row through uniform current spreading.

However, the inventive concepts are not limited thereto, and in some exemplary embodiments, the light emitting cells in the same row may be isolated from each other by the cell isolation region.

A transparent electrode 33 is disposed on each of the light emitting cells. The transparent electrodes 33 have substantially the same shape as the p-type semiconductor layer 27.

According to an exemplary embodiment, the transparent electrodes 33 may have a smaller area than the p-type semiconductor layer 27.

On the other hand, each of the light emitting cells may include a groove formed through the p-type semiconductor layer 27 and the active layer 25 to expose the n-type semiconductor layer 23. The grooves are surrounded by the transparent electrodes 33, the p-type semiconductor layer 27, and the active layer 25. As shown in FIG. 11, the groove may have an elongated shape extending from one side edge of the light emitting cell towards the other side edge thereof. For example, the grooves may have an elongated shape in the perpendicular direction with respect to the cell isolation region (ISO), as shown in FIG. 11.

The grooves formed in the light emitting cells have substantially the same size, and thus, the exposed regions of the n-type semiconductor layers 23 exposed through the grooves may also have substantially the same size. Further, the plural light emitting cells R1C1 to R2C3 have substantially the same size, and thus, the active layers 25 may have substantially the same light generation regions. More particularly, the active layers 25 may have the same shape and the grooves having the same size may be formed to pass through the active layers 25. Since the active layers 25 have the same light generation regions, electric current can be uniformly distributed to the light emitting cells. However, the inventive concepts are not limited thereto. For example, in some exemplary embodiments, the areas of the light emitting cells may be regulated to generate uniform light. For example, the light emitting cells R1C2, R2C2 disposed on the second column may have a larger area than the light emitting cells R1C1, R2C1, R1C3, R2C3 disposed on the first and third columns.

Although the grooves may be formed substantially at the same locations in the active layers 25, as shown in FIG. 11, in the light emitting cell R1C2 including the second bonding pad 37, the location of the groove may be slightly changed by the second bonding pad 37. More particularly, in order to secure a separation distance from the second bonding pad 37, the groove formed on the light emitting cell R1C2 may have a slightly shorter length than the grooves formed on other light emitting cells.

The first and second bonding pads 35, 37 may be disposed in different light emitting cells, respectively, as shown in FIG. 11. For example, the first bonding pad 35 may be disposed on the light emitting cell R2C2, and the second bonding pad 37 may be disposed on the light emitting cell R1C2.

As in the light emitting diode 200 described with reference to FIG. 9, a current barrier layer 129b is partially disposed in a region under the first bonding pad 35, and a current blocking layer 129c covers a sidewall of the mesa around the first bonding pad 35. Furthermore, a current barrier layer 129a may be disposed under the second bonding pad 37 and extensions 37a. The current barrier layer 129a may be disposed between the transparent electrode 33 and the p-type semiconductor layer 27, as in the light emitting diodes according to the exemplary embodiments described above.

Each of the first extensions 35a extends from the first bonding pad 35 and contacts the n-type semiconductor layer 23 in each of the grooves. Further, current barrier layers 129d may be disposed in an island shape under the first extensions 35a.

First electrode connecting portions 37b electrically connect the second extensions 37a disposed on adjacent light emitting cells to each other, and second electrode connecting portions 36 electrically connect the first extensions 35a to the second extensions 37a adjacent to the first extensions 35a. In order to prevent short circuit by the second electrode connecting portions 36, current blocking layers 129e may be disposed under the second electrode connecting portions 36, respectively. The first electrode connecting portions 37b are insulated from the n-type semiconductor layer 23. As such, the current blocking layers 129e may be disposed under the first electrode connecting portions 37b. Although the first insulation layer 31 is illustrated as being disposed under the first electrode connecting portions 37b in the illustrated exemplary embodiment, the inventive concepts are not limited thereto. For example, in some exemplary embodiments, other current blocking layers may be disposed to be separated from the first insulation layer 31.

In the illustrated exemplary embodiment, the first insulation layer 31 may be disposed around the light emitting cell R1C2, as in the light emitting diode 200 described with reference to FIG. 9. More particularly, the first insulation layer 31 covers a portion of the region of the p-type semiconductor layer 27 between the n-type semiconductor layer 23 exposed by the mesa M and the second bonding pad 37 on the light emitting cell R1C2. As shown in FIG. 11, the first insulation layer 31 may extend from the edge of the mesa near the second bonding pad 37 to a region between the light emitting cells. The first insulation layer 31 may be disposed to surround three sides of the second bonding pad 37, and may partially cover the side surface of the mesa M and the exposed n-type semiconductor layer 23. In some exemplary embodiments, the first insulation layer 31 may be modified as described with reference to FIG. 3 to FIG. 6.

Furthermore, the first insulation layer 31 may further cover a portion of a region of the p-type semiconductor layer 27 disposed between the second bonding pad 37 and the groove.

Figure 13:
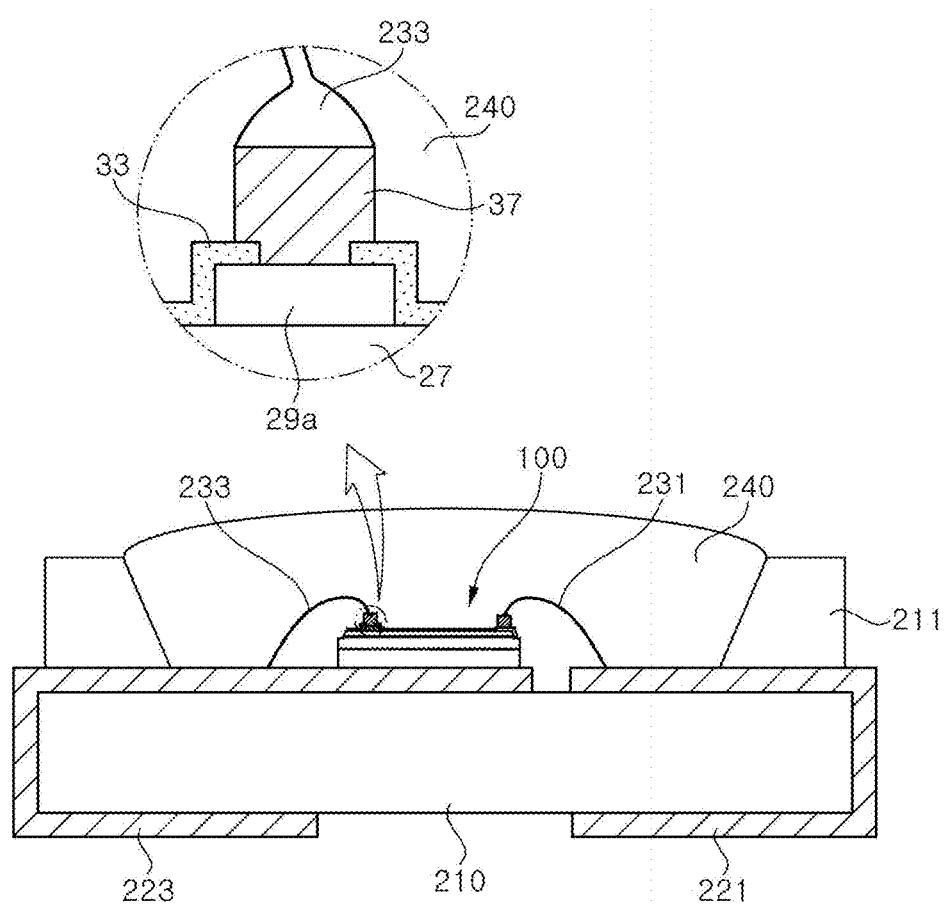
FIG. 13 is a schematic cross-sectional view of a light emitting device according to an exemplary embodiment.

FIG. 13 is a schematic cross-sectional view of a light emitting device according to an exemplary embodiment.

Referring to FIG. 13, a light emitting device according to the illustrated exemplary embodiment may include a base 210, first and second leads 221, 223, bonding wires 231, 233, a reflector 211, the light emitting diode 100, and a molding portion 240.

The base 210 may be formed of various materials, such as a plastic material or a ceramic material, and may be a printed circuit board or a molded lead frame.

The first lead 221 and the second lead 223 are attached to the base 210. The first lead 221 and the second lead 223 may be circuits printed on the base 210 or leads provided from the lead frame.

The light emitting diode 100 may be mounted on the base 210. As shown in FIG. 13, the light emitting diode 100 may be mounted on the second lead 223, without being limited thereto. Alternatively, the light emitting diode may be mounted on the first lead 221, or may be mounted on the base 210 and be separated from the first lead 221 and the second lead 223.

The bonding wire 231 is bonded to the first bonding pad 35 of the light emitting diode 100 and the bonding wire 233 is bonded to the second bonding pad 37. As shown in FIG. 13, the bonding wire 233 may include a ball portion disposed on the second bonding pad 37 and a wire portion extending therefrom. The first bonding wire 231 may also include a ball portion disposed on the first bonding pad 35 and a wire portion extending therefrom.

The ball portion of the bonding wire 233 is restrictively disposed in an upper region of the second bonding pad 37, without being limited thereto. Alternatively, the ball portion of the bonding wire 233 may be at least partially deviated to a side surface of the second bonding pad 37.

The bonding wires 231, 233 may be formed of copper or silver. Since a copper or silver wire is more economically feasible than a gold wire, the usage of the copper or silver wire may reduce manufacturing costs of the light emitting device.

An anti-metal migration layer 31 of FIG. 2A of the light emitting diode 100 may be disposed along the edge of the p-type semiconductor layer 27 adjacent at least to the bonding wire 233, which may block metals from migrating along a short distance between the bonding wire 233 and the n-type semiconductor layer 23.

The reflector 211 is disposed on the base 210 to surround the light emitting diode 100. The reflector 211 may have an inclined surface to enhance luminous efficacy of the light emitting device by reflecting light emitted from the light emitting diode 100.

The molding portion 240 may include a wavelength conversion material and molds a region surrounded by the reflector 211. Accordingly, the molding portion 240 surrounds the bonding wires 231, 233 and may adjoin the first and second bonding pads 35, 37. In addition, the molding portion 240 adjoins the first extension 35a extending from the first bonding pad 35 and the second extension 37a extending from the second bonding pad 37. Further, the molding portion 240 may adjoin the first insulation layer (or the anti-metal migration layer) 31, the transparent electrode 33, and the current blocking layer 29b. In some exemplary embodiments, the molding portion 240 may partially adjoin the n-type semiconductor layer 23 exposed around the mesa M. In the illustrated exemplary embodiment, the molding portion 240 adjoins various components of the light emitting diode 100, particularly the transparent electrode 33, through the largest contact area. Accordingly, light emitted from the light emitting diode 100 may directly enter the molding portion 240 through the transparent electrode 33, thereby improving luminous efficacy of the light emitting device.

Although the light emitting device is illustrated as having the light emitting diode 100 disposed on the base 210, the inventive concepts are not limited thereto, and in some exemplary embodiments, the light emitting device may include the light emitting diode 100a, 100b, 200, or 300, or other light emitting diodes modified therefrom. Further, the light emitting device according to exemplary embodiments is not limited to the package shape described herein, and may be implemented in the form of various packages or light emitting modules using bonding wires.

Further, the light emitting device according to exemplary embodiments may be applied to various products including lighting fixtures, displays, vehicular headlights, and the like.

Figure 14A:
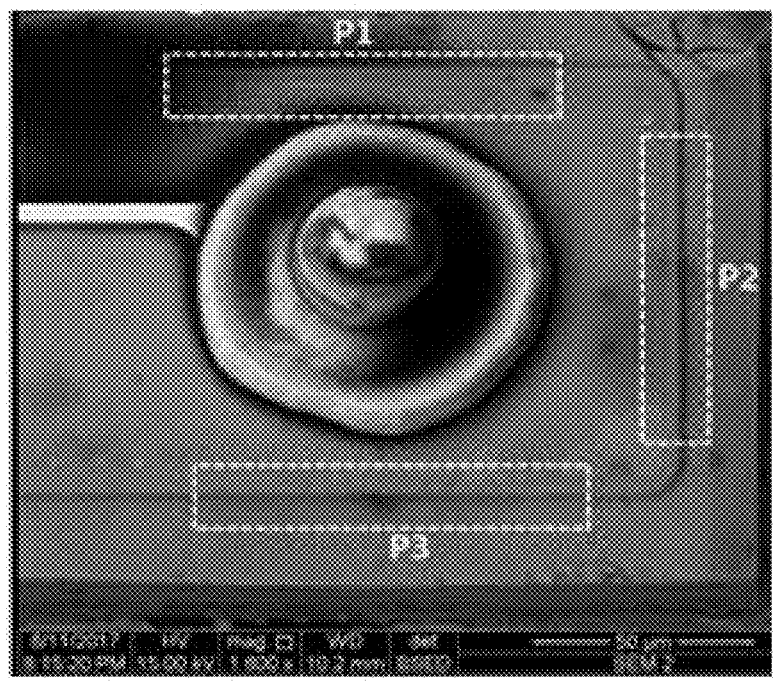
FIG. 14A is a scanning electron microscope (SEM) image of a light emitting device of a comparative example after high temperature/humidity reliability testing.
Figure 14B:
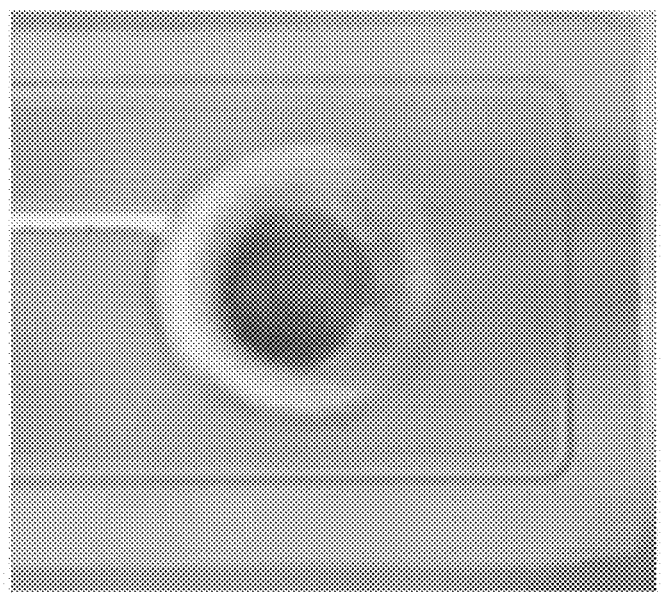
FIG. 14B is an optical image of a light emitting device of an inventive example after high temperature/humidity reliability testing.

FIG. 14A is a scanning electron microscope (SEM) image around the second bonding pad 37 of the light emitting device of a comparative example after high temperature/humidity reliability testing, and FIG. 14B is an optical image around the second bonding pad 37 of the light emitting device of the inventive example after high temperature/humidity reliability testing.

A plurality of light emitting devices were manufactured using the light emitting diodes having the structure of FIG. 1 (hereinafter, inventive example), in which the first insulation layer 31 is formed to surround the second bonding pad 37, and were subjected to reliability testing under conditions of 60° C. and 90% RH. In addition, a plurality of light emitting devices were manufactured using light emitting diodes without the first insulation layer 31 of FIG. 1 (hereinafter, comparative example) and were subjected to reliability testing under the same conditions as the inventive example. The light emitting devices of the comparative example and the inventive example employed silver wires as bonding wires.

Among the light emitting device specimens of the comparative example, many specimens suffered from current leakage and operation failure, as reliability testing was performed for a long period of time. On the contrary, the light emitting devices of the inventive example did not suffer from current leakage and operation failure.

Referring to FIG. 14A, it can be seen from the SEM image that silver aggregates were formed in portions indicated by P1, P2 and P3. The silver aggregates were concentrated around the edge of the mesa near the wire ball. However, in the inventive example including the first insulation layer 31 disposed around the second bonding pad 37 having the bonding wire, no silver aggregates were observed as shown in FIG. 14B.

Figure 15A:
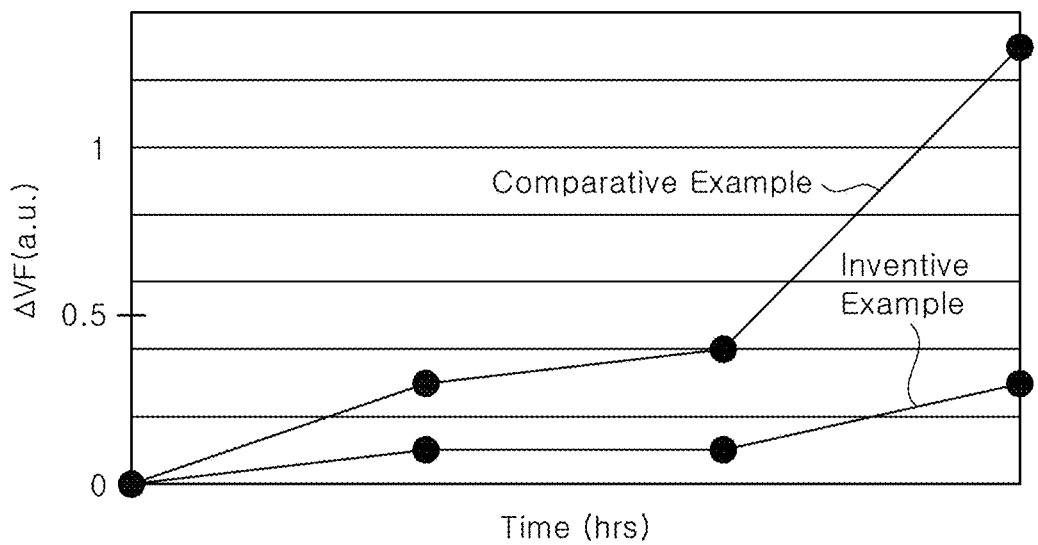
FIG. 15A is a graph depicting variation in forward voltage depending upon time in high temperature/humidity reliability testing of light emitting devices of comparative examples and inventive examples.

FIG. 15A is a graph depicting variation in forward voltage depending upon time in high temperature/humidity reliability testing of light emitting devices of comparative examples and inventive examples. The light emitting devices of the comparative example exhibited greater increase in forward voltage over time than the light emitting devices of the inventive example. Although the reason for increase in forward voltage is not apparently explained, it is believed that metal migration makes electrical characteristics of the light emitting diode unstable under high temperature/humidity conditions.

Figure 15B:
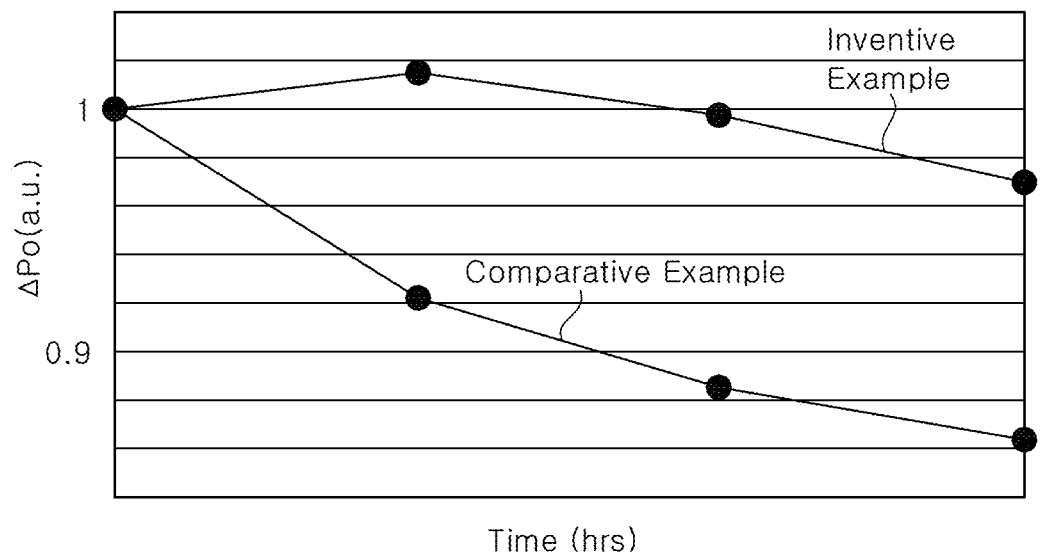
FIG. 15B is a graph depicting variation in light output depending upon time in high temperature/humidity reliability testing of light emitting devices of comparative examples and inventive examples.

FIG. 15B is a graph depicting variation in light output depending upon time in high temperature/humidity reliability testing of light emitting devices of comparative examples and inventive examples. The light emitting devices of the comparative example exhibited more rapid decrease in light output over time than the light emitting devices of the inventive example in reliability testing.

A light emitting diode according to the exemplary embodiments include a first insulation layer disposed around the second bonding pad for wire bonding, thereby improving reliability under high humidity conditions, while obviating the need for a separate protective layer to enhance light output.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting diode comprising:
an n-type semiconductor layer;
a mesa disposed on the n-type semiconductor layer to expose a portion of the n-type semiconductor layer, the mesa comprising an active layer and a p-type semiconductor layer disposed on the active layer;
a first bonding pad electrically connected to the n-type semiconductor layer;
a second bonding pad electrically connected to the p-type semiconductor layer; and
a first insulation layer at least partially disposed between the exposed portion of the n-type semiconductor layer exposed by the mesa and the second bonding pad, wherein:
the first insulation layer covers a first portion of the p-type semiconductor layer disposed between the second bonding pad and the exposed portion of the n-type semiconductor layer;
the first insulation layer is disposed along an edge of the p-type semiconductor layer adjacent to the exposed portion of the n-type semiconductor layer; and
the mesa has a side surface including a first portion covered with the first insulation layer and a second portion exposed by the first insulation layer, the second portion of the mesa having a greater area than the first portion of the mesa.

2. The light emitting diode according to claim 1, wherein the first insulation layer is disposed closer to the exposed portion of the n-type semiconductor layer than the second bonding pad.

3. The light emitting diode according to claim 2, wherein the first insulation layer partially covers the exposed portion of the n-type semiconductor layer.

4. The light emitting diode according to claim 1, wherein the first insulation layer has a greater length than the second bonding pad.

5. The light emitting diode according to claim 4, wherein the first insulation layer continuously surrounds three sides of the second bonding pad in plan view.

6. The light emitting diode according to claim 1, wherein:
the mesa has an elongated shape;
the second bonding pad is disposed near a distal end of the mesa at one side thereof in a longitudinal direction of the mesa to oppose the first bonding pad; and
the first insulation layer partially covers a second portion of the p-type semiconductor layer between the second bonding pad and the distal end of the mesa.

7. The light emitting diode according to claim 6, wherein the first insulation layer covers the side surface of the mesa near the distal end thereof and the exposed portion of the n-type semiconductor layer.

8. The light emitting diode according to claim 6, wherein the first insulation layer extends from a portion near the distal end of the mesa along an edge of the mesa in the longitudinal direction.

9. The light emitting diode according to claim 8, wherein a length of the first insulation layer extending along the longitudinal direction is greater than a width of the second bonding pad and less than ½ of a maximum length of the mesa.

10. The light emitting diode according to claim 1, wherein:
the mesa comprises a groove formed through the p-type semiconductor layer and the active layer to expose the n-type semiconductor layer; and
the first insulation layer covers a portion of the p-type semiconductor layer disposed between the groove and the second bonding pad.

11. The light emitting diode according to claim 1, further comprising a second insulation layer spaced apart from the first insulation layer,
wherein:
the mesa comprises a groove formed through the p-type semiconductor layer and the active layer to expose the n-type semiconductor layer; and
the second insulation layer covers a portion of the p-type semiconductor layer disposed between the groove and the second bonding pad.

12. The light emitting diode according to claim 11, wherein the second insulating layer covers a portion of a sidewall of the groove.

13. The light emitting diode according to claim 1, further comprising a transparent electrode forming ohmic contact with the p-type semiconductor layer,
wherein the second bonding pad is disposed on the transparent electrode to be electrically connected to the transparent electrode.

14. The light emitting diode according to claim 13, wherein the transparent electrode covers a portion of the first insulation layer.

15. A light emitting diode comprising:
an n-type semiconductor layer;
a mesa disposed on the n-type semiconductor layer to expose a portion of the n-type semiconductor layer, the mesa comprising an active layer and a p-type semiconductor layer disposed on the active layer;
a first bonding pad electrically connected to the n-type semiconductor layer;
a second bonding pad electrically connected to the p-type semiconductor layer;
a first insulation layer at least partially disposed between the exposed portion of the n-type semiconductor layer exposed by the mesa and the second bonding pad; and
a transparent electrode forming ohmic contact with the p-type semiconductor layer and covering a portion of the first insulation layer,
wherein:
the first insulation layer covers a first portion of the p-type semiconductor layer disposed between the second bonding pad and the exposed portion of the n-type semiconductor layer, and is disposed along an edge of the p-type semiconductor layer adjacent to the exposed portion of the n-type semiconductor layer;
the second bonding pad is disposed on the transparent electrode to be electrically connected to the transparent electrode;
the transparent electrode and the first insulation layer overlaps each other in a first width, and the transparent electrode is spaced apart from an edge of the p-type semiconductor layer by a second width;
the first width is greater than the second width w2; and
the first width w1 is equal to or less than 10 µm.

16. The light emitting diode according to claim 15, wherein the first width is 5 µm and the second width is 4 µm.

17. The light emitting diode according to claim 15, further comprising a first extension extending from the first bonding pad and electrically connected to the n-type semiconductor layer through holes formed in the first insulation layer.

18. The light emitting diode according to claim 15, further comprising a first extension extending from the first bonding pad,
wherein the first insulation layer comprises a plurality of islands spaced apart from each other, the first extension being electrically connected to the n-type semiconductor layer between the islands.

19. The light emitting diode according to claim 13, wherein a portion of the first insulation layer covers the transparent electrode.

20. The light emitting diode according to claim 13, wherein a side surface of the first insulation layer and a side surface of the transparent electrode are disposed to face each other.

* * * * *